US007816838B2

United States Patent
Leskinen et al.

(10) Patent No.: US 7,816,838 B2
(45) Date of Patent: Oct. 19, 2010

(54) PIEZOELECTRIC FORCE SENSING

(75) Inventors: Miikka Leskinen, Espoo (FI); Jukka Jalkanen, Vantaa (FI); Turo Keski-Jaskari, Vantaa (FI)

(73) Assignee: Nokia Corporation, Espoo (FI)

( * ) Notice: Subject to any disclaimer, the term of this patent is extended or adjusted under 35 U.S.C. 154(b) by 394 days.

(21) Appl. No.: 11/954,206

(22) Filed: Dec. 11, 2007

(65) Prior Publication Data

US 2009/0146533 A1 Jun. 11, 2009

(51) Int. Cl.
*H01L 41/08* (2006.01)
(52) U.S. Cl. ...................... 310/319; 310/338
(58) Field of Classification Search ................ 310/317, 310/319
See application file for complete search history.

(56) References Cited

U.S. PATENT DOCUMENTS

| | | | | |
|---|---|---|---|---|
| 2,614,416 A | | 2/1950 | Hollmann | |
| 4,428,228 A | * | 1/1984 | Banzhaf et al. | 73/114.45 |
| 4,479,070 A | * | 10/1984 | Frische et al. | 310/338 |
| 5,062,294 A | * | 11/1991 | Iwata | 73/114.21 |
| 7,305,889 B2 | * | 12/2007 | Fortin et al. | 73/756 |
| 2005/0199069 A1 | * | 9/2005 | Fortin et al. | 73/718 |
| 2007/0103449 A1 | | 5/2007 | Laitinen et al. | |
| 2007/0138584 A1 | * | 6/2007 | Fortin et al. | 257/419 |

OTHER PUBLICATIONS

"Introduction to Piezoelectric Force Sensors", Dytran Instruments, Inc., published prior to filing of this application, 3 pages.

* cited by examiner

*Primary Examiner*—Mark Budd
(74) *Attorney, Agent, or Firm*—Banner & Witcoff, Ltd.

(57) ABSTRACT

A system and method for measuring absolute pressure applied to a piezoelectric element by measuring a transition time of a voltage pulse applied to a piezoelectric element. The transition time (such as the rise time and/or fall time of the voltage pulse) is affected by the capacitance of the piezoelectric element, which in turn is affected by the amount of pressure currently being applied to the piezoelectric element. The system may also provide haptic feedback via the same piezoelectric element.

13 Claims, 6 Drawing Sheets

PIEZOELECTRIC FORCE SENSING

BACKGROUND

A piezoelectric element generates an electric field (and a measurable voltage from the field) in response to applied pressure. However, a piezoelectric element generates such electric fields only in response to changes in the applied pressure. In other words, a piezoelectric element conventionally acts as a dynamic pressure sensor. This by itself may be useful for measuring constantly pulsing pressures, such as vibrations in a car or other mechanical machine, or for example in seismometers. This dynamic response may also be utilized in some computer user interfaces where the mere presence of a short press is sufficient for input recognition without the need for absolute pressure determination.

Because of this dynamic nature of the electrical field response, conventional devices with piezoelectric sensors have not been typically used for sensing a constant pressure or for determining the absolute value of a dynamic or constant pressure.

Piezoelectric elements also change shape in response to a dynamic electrical field. Thus, in addition to dynamic pressure sensing, some devices also provide haptic feedback (e.g., active vibration) using the same piezoelectric element used for pressure sensing. However, relatively high driving voltages (e.g., about one hundred volts) are typically used for haptic feedback, as compared with the smaller voltages (e.g., one or two volts) typically generated in response to pressure changes. Because the piezoelectric element acts as a capacitor, the use of two very different voltage ranges can pose the practical problem of preventing high voltages stored in the piezoelectric element (due to haptic feedback operations) from being discharged into sensitive low-voltage amplifier electronics used for dynamic pressure sensing.

SUMMARY

Certain aspects are directed to measuring a transition time of a voltage pulse applied to a piezoelectric element. The transition time (such as the rise time and/or fall time of the voltage pulse) is affected by the capacitance of the piezoelectric element, which in turn is affected by the amount of pressure currently being applied to the piezoelectric element. Using such a system and process, it is now possible to measure the actual current magnitude of the pressure (also referred to herein as the absolute pressure) being applied to the piezoelectric element, as opposed to or in addition to measuring the change or delta in pressure. This opens up a wide variety of possibilities, such as by providing absolute pressure-sensitive computer user interfaces.

Further aspects are directed to generating haptic feedback to the piezoelectric element while also using the piezoelectric element as a pressure sensor. This may be done by generating, either in alternation with or coinciding with, larger magnitude haptic feedback voltage pulses.

These and other aspects of the disclosure will be apparent upon consideration of the following detailed description of illustrative aspects.

BRIEF DESCRIPTION OF THE DRAWINGS

A more complete understanding of the present disclosure may be acquired by referring to the following description in consideration of the accompanying drawings, in which like reference numbers indicate like features, and wherein.

It is noted that the figures are not necessarily drawn to scale.

DETAILED DESCRIPTION

The various aspects described herein may be embodied in various forms. The following description shows by way of illustration various examples in which the aspects may be practiced. It is understood that other examples may be utilized, and that structural and functional modifications may be made, without departing from the scope of the present disclosure.

Except where explicitly stated otherwise, all references herein to two or more elements being "coupled," "connected," and "interconnected" to each other are intended to broadly include both (a) the elements being directly connected to each other, or otherwise in direct communication with each other, without any intervening elements, as well as (b) the elements being indirectly connected to each other, or otherwise in indirect communication with each other, with one or more intervening elements.

Figures 1, 2:
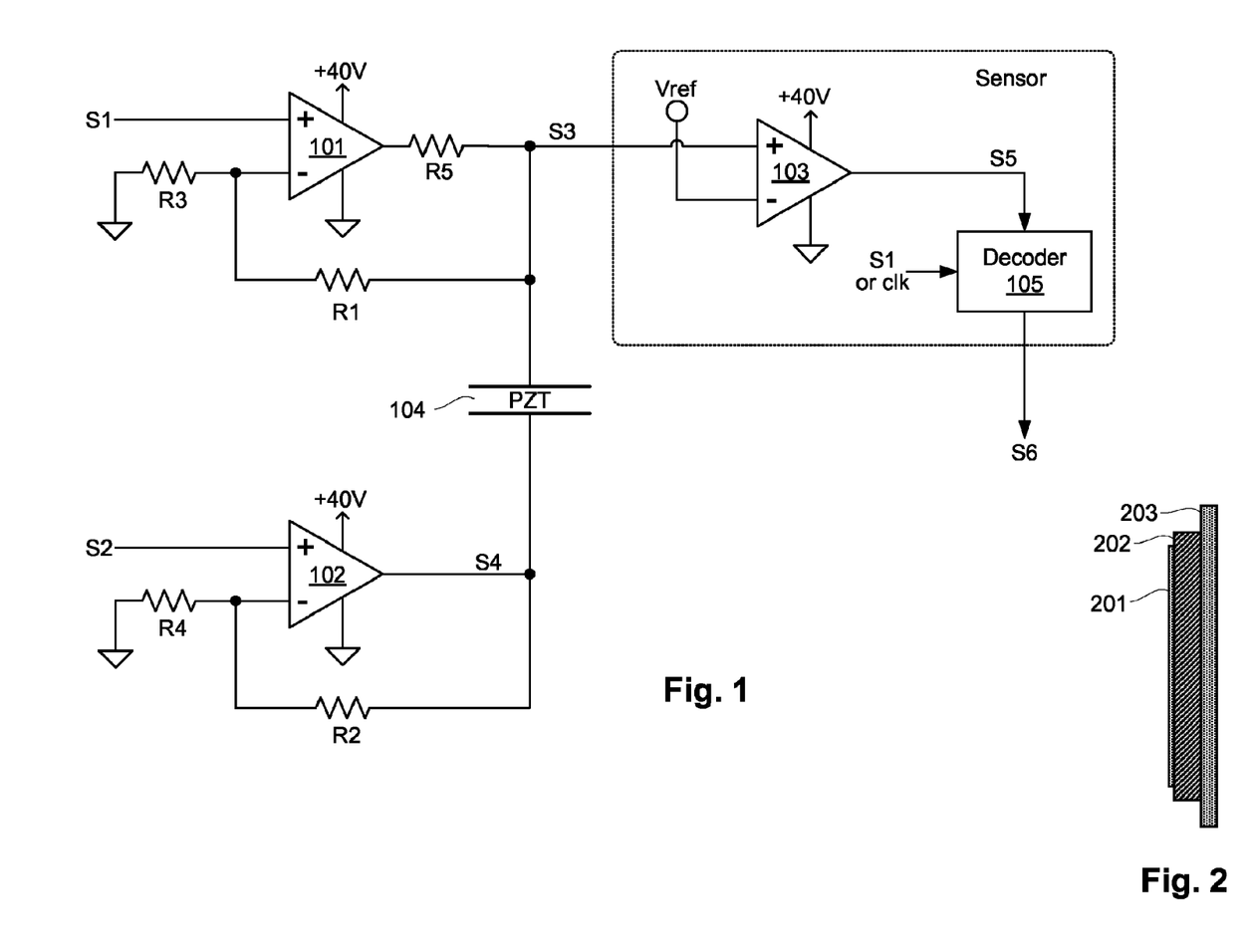
FIG. 1 is a schematic diagram of an illustrative circuit that may be used to control haptic feedback in a piezoelectric element and also to measure force applied to the piezoelectric element.
FIG. 2 is a cut-away side view of an illustrative piezoelectric element.

FIG. 1 is a schematic diagram of an illustrative circuit that may be used to control haptic feedback in a piezoelectric element and also to measure force applied to the piezoelectric element. In this example, operational amplifier 101, operational amplifier 102, operational amplifier 103, and a piezoelectric transducer (PZT) 104 are coupled into a circuit as shown.

Operational amplifiers 101 and 102 are each configured in this example as a non-inverting differential amplifier using resistors R1, R3, and R5, and resistors R2 and R4, respectively. Operational amplifiers 101 and 102 are used to drive PZT 104 with both sensing pulses and larger haptic feedback pulses.

Operational amplifier 101 is powered in this example between a first voltage supply level (such as +40 volts) and ground, and is configured to receive a signal S1 and generate and feed a signal S3 into a first electrode of PZT 104. Disregarding for the moment the effects of the capacitance of PZT 104, signal S3 is essentially an amplified version of signal S1, with a gain of 1+(R1+R5)/R3.

Operational amplifier 102 is also powered in this example between +40 volts and ground, and is configured to receive a signal S2 and generate and feed a signal S4 into a second opposing electrode of PZT 104. Again disregarding for the moment the effects of the capacitance of PZT 104, signal S4 is essentially an amplified version of signal S2, with a gain of 1+R2/R4.

PZT 104 may be any commercially available or custom-made PZT, and includes one or more piezoelectric material wafers with electrodes appropriately disposed thereon in a manner that is conventionally known. Non-limiting examples of piezoelectric material include ceramics such as lead zirconate titanate, barium titanate, and lead titanate, crystals such as gallium orthophosphate and langasite, and even polymers such as polyvinylidene fluoride.

The capacitance of PZT 104 changes in accordance with the amount of physical pressure applied to the piezoelectric element. This is because the pressure slightly changes the thickness and/or shape of the piezoelectric element, thereby changing the distance between the electrodes of the piezoelectric element. More pressure flexes the piezoelectric element so as to the electrodes slightly closer together (thereby increasing the capacitance between the electrodes), while less pressure allows the piezoelectric element to come back to a resting position, thereby allowing the electrodes to move slightly apart again (thereby reducing the capacitance between the electrodes). FIG. 2 shows an example of a piezoelectric element that may be used in PZT 104, having a piezoelectric material 202 sandwiched between conductive (e.g., metal) electrodes 201 and 203. One of the electrodes (e.g., electrode 203) may be a metal sheet, and the other of the electrodes (e.g., electrode 201) may be a conductive coating on piezoelectric material 202, such as silver plating. Such a construction is widely known and commonly used in piezoelectric beepers. A capacitance is formed in that piezoelectric material 202 acts as a dielectric between electrodes 201 and 203. As the thickness and/or shape of piezoelectric material 202 varies with applied pressure, the distance between electrodes 201 and 203 also varies, thereby changing the capacitance of the piezoelectric element. The embodiment of FIG. 2 is only one possible configuration of a piezoelectric element. For example, the piezoelectric element may have multiple piezoelectric material wafers, and may be of any shape, such as circular or rectangular.

As will be seen, this capacitance change of PZT 104 can be directly or indirectly measured to determine the amount of pressure applied to PZT 104. In contrast with electric fields being produced across a piezoelectric element in response to changes or differences in pressure over time, the capacitance depends upon the magnitude of the pressure currently being applied, also referred to herein as the absolute pressure, at any given instant. For instance, if the pressure is increased from P1 to P2 over time, then the difference in pressure would be (P2−P1), whereas the absolute pressure would start at P1 and later be at P2. And, depending upon the particular configuration of the piezoelectric element, the capacitance of the piezoelectric element may be related linearly to the amount of absolute applied pressure. It is further noted that "pressure" is intended to include both positive pressure (e.g., a squeezing force applied to PZT 104) as well as negative pressure (e.g., a pulling force applied to PZT 104). In either case, the capacitance of PCT 104 would be affected accordingly.

In the discussion above, the effects of the capacitance of PZT 104 have been disregarded for simplicity when describing the nature of signals S3 and S4. However, the capacitance of PZT 104 does affect these signals—by affecting the rise times of signals S3 and S4. Because there is a one-to-one correspondence between applied pressure and capacitance of PZT 104, the rise time of one or both of signals S3 and S4 may be used to determine the amount of pressure applied to PZT 104.

In the present example, the circuit of FIG. 1 detects the rise time of signal S3 to determine applied pressure. To detect the rise time, signal S1 is pulsed in voltage to produce what will be referred to herein as a measurement pulse, and operational amplifier 101 pulses signal S3 in response. To detect the rise time of the pulse of signal S3, operational amplifier 103 is configured to compare the voltage of signal S3 with a reference voltage Vref and to provide an output signal S5 based on the comparison. Because in this example operational amplifier 103 is configured as an open-loop differential amplifier, the output of operational amplifier 103 will be zero when the voltage of S4 is below Vref, but the output will quickly change to maximum level (in this case, the level of supply voltage +40V) in response to the voltage of S4 even slightly exceeding Vref. An open-loop differential amplifier has an output that is essentially stable only at the lowest power supply voltage (in this case, ground) and the highest power supply voltage (in this case, 40 volts), and so signal S5 may be considered a digital signal that indicates either of two states: either signal S3 does not exceed Vref (S5=0 volts in this case), or signal S3 exceeds Vref (S5=40 volts in this case). Then, digital signal S5 is received by decoder 105 from which it determines the rise time of signal S3. Thus, in effect, operational amplifier 103 (with or without optional decoder 105) acts as a sensor for measuring the rise time of signal S3.

As can be seen, for signal S5 to represent the rise time of signal S3, the peak voltage of the measurement pulses of signal S3 should be higher than Vref in this particular example. Otherwise, the output of operational amplifier 103 would not change. However, the measurement pulses may still be of a relatively small voltage, such as just a few volts (e.g., five volts or less, or ten volts or less). Such low voltage measurement pulses may thus provide for measurement capability without necessarily driving PZT 104 sufficiently to unintentionally generate haptic feedback. In addition, reference voltage Vref may be a fixed potential or it may be of a potential that varies over time.

In addition to measuring applied pressure, the circuit of FIG. 1 may also be used to drive PZT 104 with relatively large pulses that cause PZT 104 to move to a degree that is palpable to a human user. To create such movements, which are referred to herein as haptic feedback, PZT 104 is pulsed with sufficient voltage to cause palpable vibration or other movement. Typically, this voltage is in the range of 75 volts or more. However, the amount of voltage needed to produce haptic feedback depends greatly upon the type of PZT 104 used. By the same token, the measurement pulses discussed in the previous paragraph may be of sufficiently low voltage such that their effect on PZT 104 is not palpable to a human user. Nonetheless, regardless of whether such measurement pulses are palpable by a human user, the measurement pulses will generally be of a voltage magnitude smaller than the haptic feedback pulses.

For haptic feedback pulses, both operational amplifiers 101 and 102 may be used, which may allow for a larger peak-to-peak pulse voltage from the point of view of PZT 104. In other embodiments, both operational amplifiers 101 and 102 may be tied to the same power supply voltages of 0 volts and 40 volts, which would still provide up to an 80 volt peak-to-peak variation from the point of view of PZT 104. In still other embodiments, operational amplifier 102 may not be necessary, and the electrode of PZT 104 shown as connected to signal S4 may be instead tied to a fixed potential such as ground. Such a configuration would allow for pressure sensing without providing for haptic feedback functionality. In such a case, there would be no need for operational amplifier 102, and resistors R2 and R4.

Thus, PZT 104 may be driven by small measurement pulses for sensing applied pressure and by relatively larger haptic feedback pulses to provide haptic feedback to the user, all with the same circuitry. In the example of FIG. 1, the small measurement pulses are provided only by operational amplifier 101. This means that, in this example, PZT 104 would flex in response to the measurement pulses in only one direction (i.e., between a resting position and a first flexed position). However, in the example of FIG. 1, the haptic feedback pulses are provided by both operational amplifiers 101 and 102 operating in coordination with each other. This means that PZT 104 could flex in two directions, thus approximately doubling the movement range of PZT 104 (i.e., between the resting position and the first flexed position, and also between the resting position and an opposite second flexed position).

Figure 3:
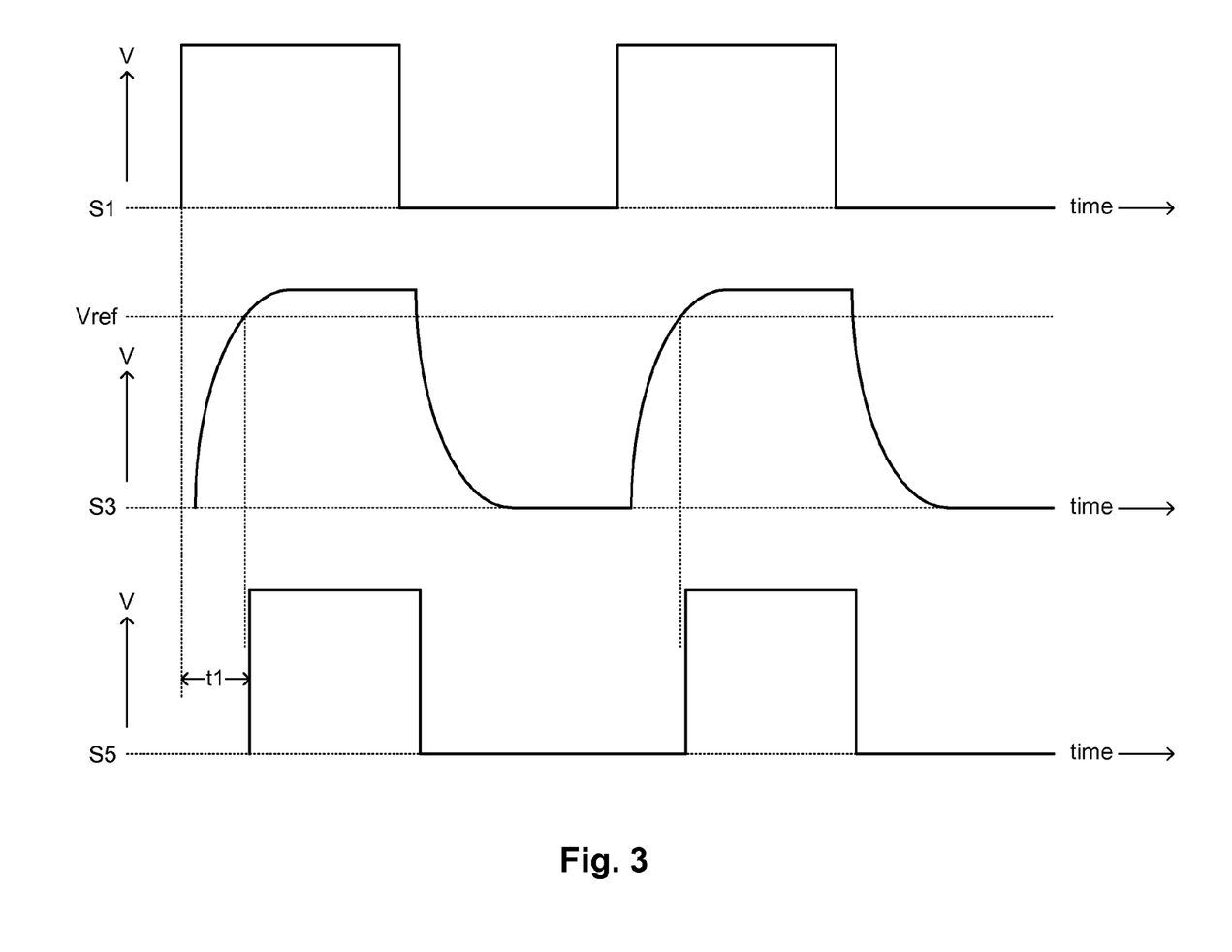
FIG. 3 shows several illustrative waveforms of signals that may be used in or generated by the circuit of FIG. 1.

The operation of the circuit of FIG. 1 will be described with reference to the illustrative waveforms in FIGS. 3-5. Referring to FIG. 3, illustrative waveforms of signals S1, S3, and S5 are shown. In this example, signal S1 is a square wave. However, the pulses of signal S1 may be of any shape and may be periodic or a-periodic. The frequency of the measurement pulses of S1 may be low, such as ten Hertz or less, or even five Hertz or less.

In response to signal S1, operational amplifier 101 generates signal S3 such as shown. As can be seen, the rising edge has been stretched in time due to the capacitance of PZT 104. Where the capacitance is larger, the rising edge is stretched further. Where the capacitance is smaller, the rising edge is stretched less. Thus, the capacitance of PZT 104 has a direct effect on the rise time of the rising edge of signal S3.

Operational amplifier 103 continuously receives signal S3 and compares it with reference voltage Vref. In response to signal S3 exceeding Vref, operational amplifier 103 will suddenly swing its output (signal S5) from zero volts to 40 volts. In FIG. 3, the time from when signal S1 begins a pulse to the time when signal S5 swings high is shown as time t1. As will be apparent to one of ordinary skill in the art, this time will vary with the rise time of signal S3, and thus can be used as an indicator of the rise time, which in turn can be used as an indicator of the capacitance of PZT 104, which in turn can be used as an indicator of the absolute pressure applied to PZT 104.

Figure 4:
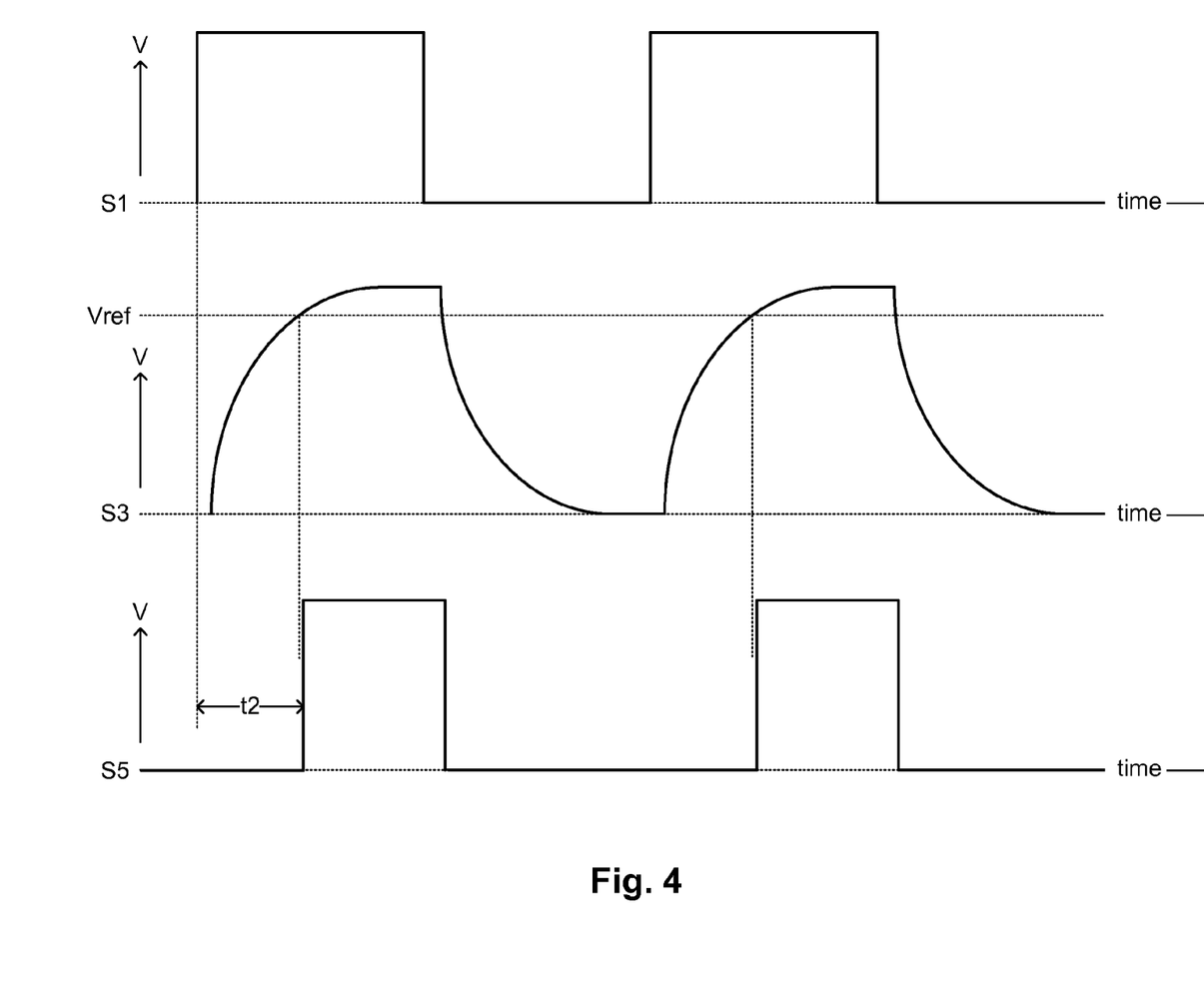
FIG. 4 shows several further illustrative waveforms of signals that may be used in or generated by the circuit of FIG. 1.

Another example is shown in FIG. 4, in which case the applied pressure is higher, and therefore the capacitance of PZT 104 is also higher. This means a longer rise time of signal S3. In this example, the time from when signal S1 begins a pulse to the time when signal S5 swings high is shown as time t2. As can be seen, time t2 is longer than time t1, indicating a longer rise time.

Thus, the phase timing of signal S5 maps to a particular rise time. A longer delay before S3 transitions maps to a longer rise time, and a shorter delay before S3 transitions maps to a shorter rise time. Accordingly, decoder 105 may be configured to determine the delay in signal S5 and convert that delay to an appropriately formatted output at signal S6. For example, decoder 105 may map the delay to an analog voltage, or where digital signals are desired, decoder 105 may include an analog-to-digital converter to convert the delay to a digital multi-bit numerical value. There are many ways of converting a measured delay to a numerical value that are known to ones of ordinary skill in the relevant art. For example, where a main processor or dedicated user interface processor is already generating or controlling signal S1, then signal S5 may be simply fed back to that processor for determining the delay. In such a case, signal S5 may be connected to an interrupt or timer input of the processor or to some other input pin. In some instances, it may be desirable to embody decoder 105 as a separate processor or system that is not responsible for generating or controlling signal S1. In other words, decoder 105 may not inherently know the timing of signal S1. In such a case, decoder 105 may be provided with signal S1 or another related timing signal, such as a clock, from which to reference the phase delay in signal S5, by measuring the amount of time from a transition in signal S1 or the clock to the time that the transition occurs in signal S5. The output signal S6 would thus represent, or otherwise depend upon, the absolute amount of force being applied to PZT 104.

While rise times have been discussed as an example, the concepts described herein may be equally applied to either type of signal transition—rising or falling. Thus, the concepts may be applied to fall time (the time for a falling edge to occur). In such a case, rather than measuring the rise time of the leading edge of pulse S3, the fall time of the falling edge of pulse S3 may be measured. The fall time will also depend upon the capacitance of PZT 104 in the same manner as the rise time. In fact, for the particular circuit shown in FIG. 1, the rise and fall times of signal S3 would be equal to each other for any given applied pressure.

Figure 5:
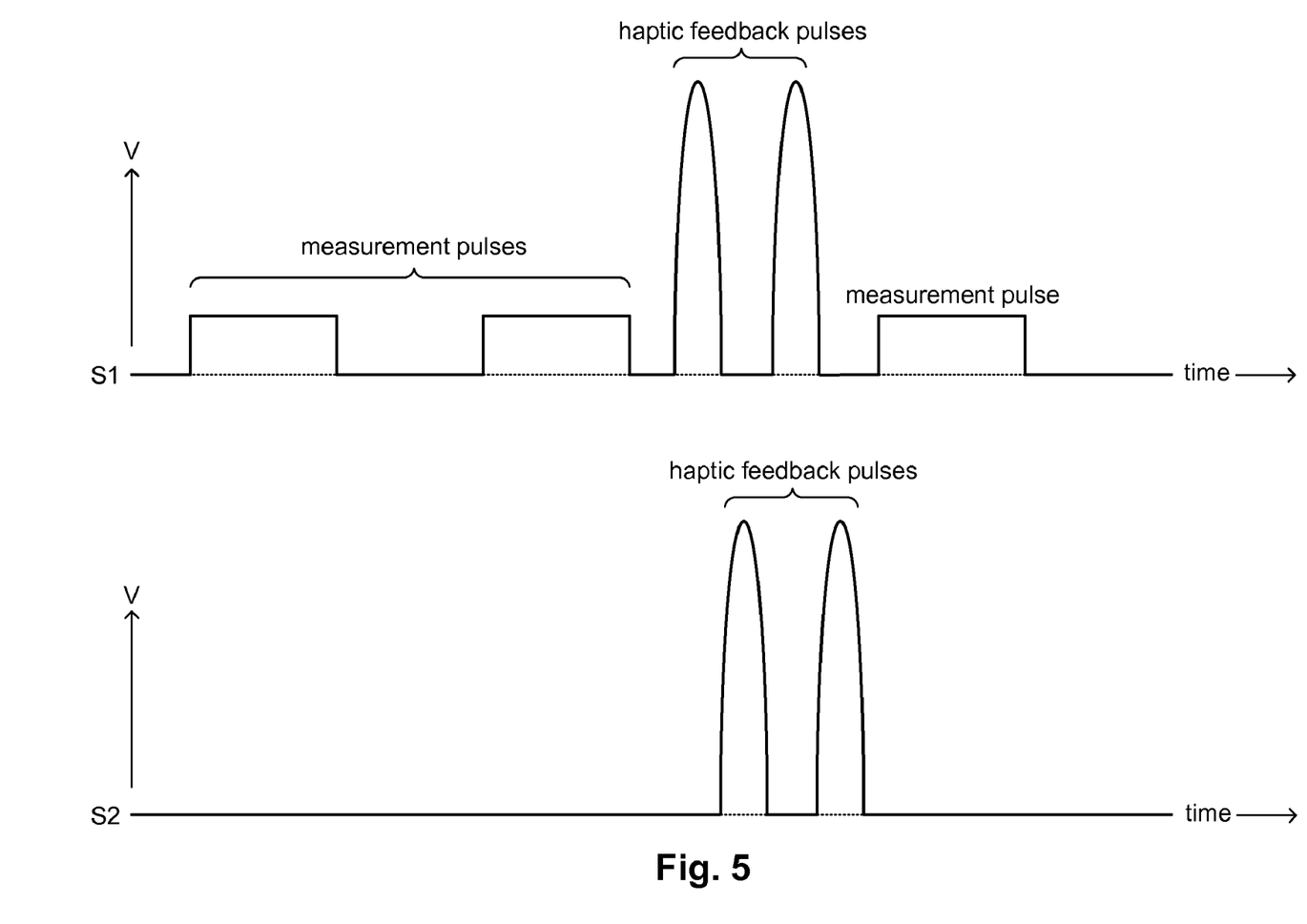
FIG. 5 shows several further illustrative waveforms of signals that may be used in or generated by the circuit of FIG. 1.

FIG. 5 shows an example where both measurement pulses and haptic feedback pulses occur in the circuit of FIG. 1. As can be seen, the measurement pulses in this example are of a significantly lower voltage magnitude than the haptic feedback pulses. For example, the measurement pulses may be on the order of just a few volts (e.g., three volts or less, or five volts or less), whereas the haptic feedback pulses may be many times larger (e.g., thirty volts or more, or forty volts or more). This is a simplified example, and there may actually be many more haptic feedback pulses. In the present example, a haptic feedback pulse is provided on signal S1, then immediately afterward another haptic feedback pulse is provided on signal S2, and then the pair repeats. This alternating sequence of haptic pulses on signals S1 and S2 may allow for a large peak-to-peak voltage as seen by PZT 104, thereby causing PZT 104 to vibrate in an amount palpable by a human. However, it is also possible to overlap the haptic pulses between signals S1 and S2. In the present example, signal S2 is maintained by operational amplifier 102 at a constant potential (in this example, ground) while the measurement pulses are being made. However, signal S2 does not necessarily need to be fixed at a constant potential, and may vary especially if haptic feedback pulses are simultaneously or nearly simultaneously being generated with the measurement pulses, as discussed further below.

The measurement pulses may be short or long as desired. For instance, the measurement pulses may be less than ten milliseconds in length or shorter. Alternatively, the measurement pulses may be longer. In any event, the measurement pulses should be of sufficient length so as to allow for completion of the longest expected rise (or fall) time. In addition, the haptic feedback pulses may be at a significantly higher frequency than the measurement pulses. For instance, where the measurement pulses may be on the order of ten hertz or less, or five hertz or less, the haptic feedback pulses may be on the order of thousands of hertz. Of course, if desired the haptic feedback pulses may also be of a lower frequency that is the same as or lower than the frequency of the measurement pulses. However, a lower frequency of measurement pulses may be desirable in order to reduce power consumption, without necessarily reducing the accuracy of the measurements. For instance, while the measurement pulses themselves may be very short, they may be produced at a frequency of only ten Hertz or less, or five Hertz or less, to save power. It may be especially desirable to save power in this manner where the circuitry of FIG. 1 is used in a mobile handheld electronic device powered by an on-board battery, such as a cellular telephone or other wireless mobile communication device, or a personal digital assistant (PDA).

Although the measurement pulses S1 may be generated at a fixed frequency, they may alternatively vary in frequency. The frequency that the measurement pulses S1 are provided may depend upon one or more factors. For example, the measurement pulses may be provided at a first frequency until a threshold pressure or a threshold change in the pressure applied to PZT 104 is sensed. In response to sensing this threshold being exceeded, the system may increase the frequency of the measurement pulses S1, which may in turn provide a higher time resolution for sensing absolute pressure. By varying measurement pulse frequency in this manner, additional power may be saved. In addition, the frequency of the measurement pulses S1 may depend upon whether haptic feedback is occurring. For example, the measurement pulses S1 may be temporarily stopped until the haptic feedback is finished. Alternatively, the measurement pulses S1 may continue while the haptic feedback is occurring.

In addition, the measurement function of the circuit of FIG. 1 does not necessarily need to pause while haptic pulses are being generated. In previous examples it has been assumed for simplicity that the measurement pulses in signal S1 are square wave pulses with a flat upper voltage, and that Vref is a fixed potential. However, in some embodiments the haptic feedback pulses themselves may also be used for taking measurements. Thus, where a haptic feedback pulse is included in signal S1 (and thus propagated through to signal S3), the system may be configured to accurately measure and interpret the rise time of the haptic feedback pulse in signal S3. To do so, the system may need to be able to vary Vref and have knowledge of the pulse characteristics of the system over a wide frequency spectrum and amplitude range in relation to applied pressure (such as via a lookup table or via a generated mathematical model of the system). In such a case, since the system would know what pulse is being fed to PZT 104, the system could adjust Vref to set it at a certain voltage level such that time time for signal S3 to reach that voltage level would map to the level of pressure applied to PZT 104. This simultaneous measurement and haptic feedback functionality may be desirable where a great deal of haptic feedback is provided to the user that might otherwise interfere with pressure measurements for a long period of time. This might be important, for instance, in a video game environment where precise timing of user inputs may determine game outcome.

There are many variations to the circuit of FIG. 1 that may be created. For example, one or more resistors may be added or removed, and/or one or more signal filters may be added. In some embodiments, for instance, resistor R5 may be removed, in which case it may be desirable to couple one of the electrodes of PZT 104 to a node between resistors R1 and R3. Also, the power supply voltages for operational amplifiers 101-103 may be different from 40 volts, and in fact the power supply voltages may be different for each of the operational amplifiers 101-103. For example, operational amplifier 101 may operate between +40 volts and ground, while operational amplifier 102 may operate between ground and −40 volts. In still further embodiments, a low-pass filter may be added to the positive input of operational amplifiers 101 and/or 102. This may be desirable where, for example, a digital-to-analog converter is used to produce signal S1, in which case the low-pass filter may be used to smooth signal S1 prior to being fed into operational amplifier 101. Additionally, a buffer may be added between operational amplifier 103 and decoder 105 (or included in decoder 105) to reduce the voltage of signal S5 to a logic voltage (e.g., from a 40 volt waveform to a 1.5 volt waveform).

The various resistors may be of any resistance desired. In one example, the following resistances may be used: R1=R2=56 k ohms, R3=R4=20 k ohms, and R5=200 ohms. In this example, the operational amplifiers may be embodied as one or more Motorola TCA0372 chips. Also, PZT 104 may be (for instance) embodied as a 0.2 millimeter thick ceramic layer on a 0.1 millimeter thick brass electrode.

Figure 6:
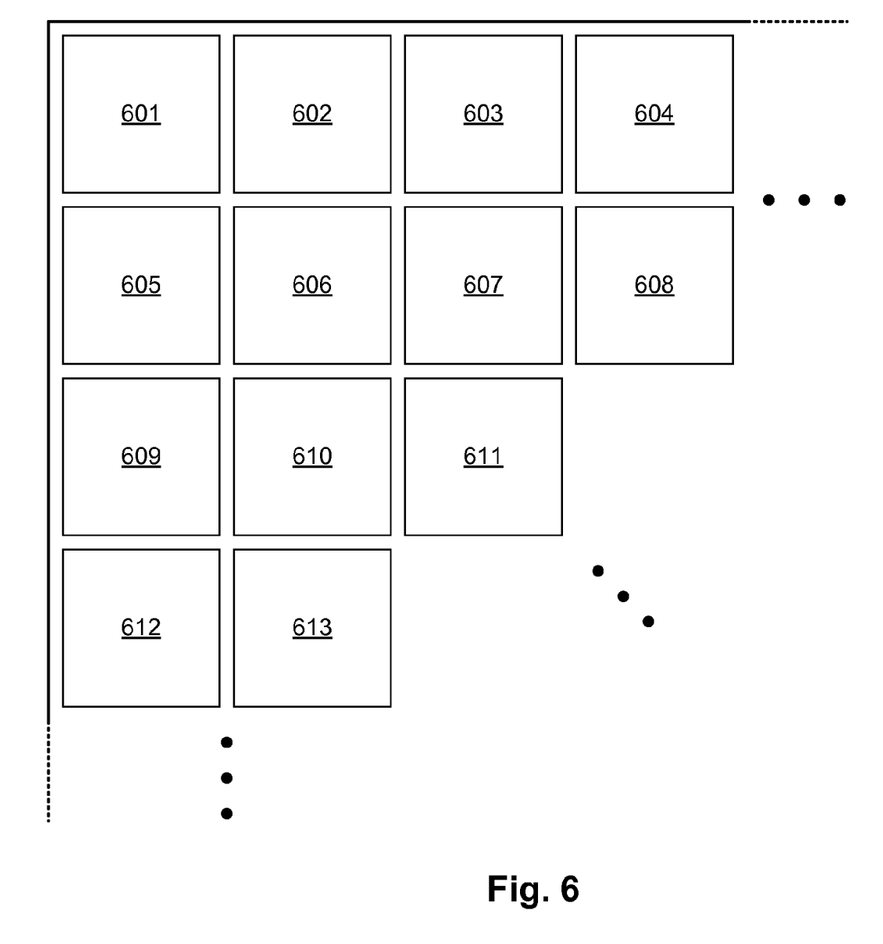
FIG. 6 is a plan view of an illustrative array of piezoelectric circuits such as the circuit of FIG. 1.
Figure 7:
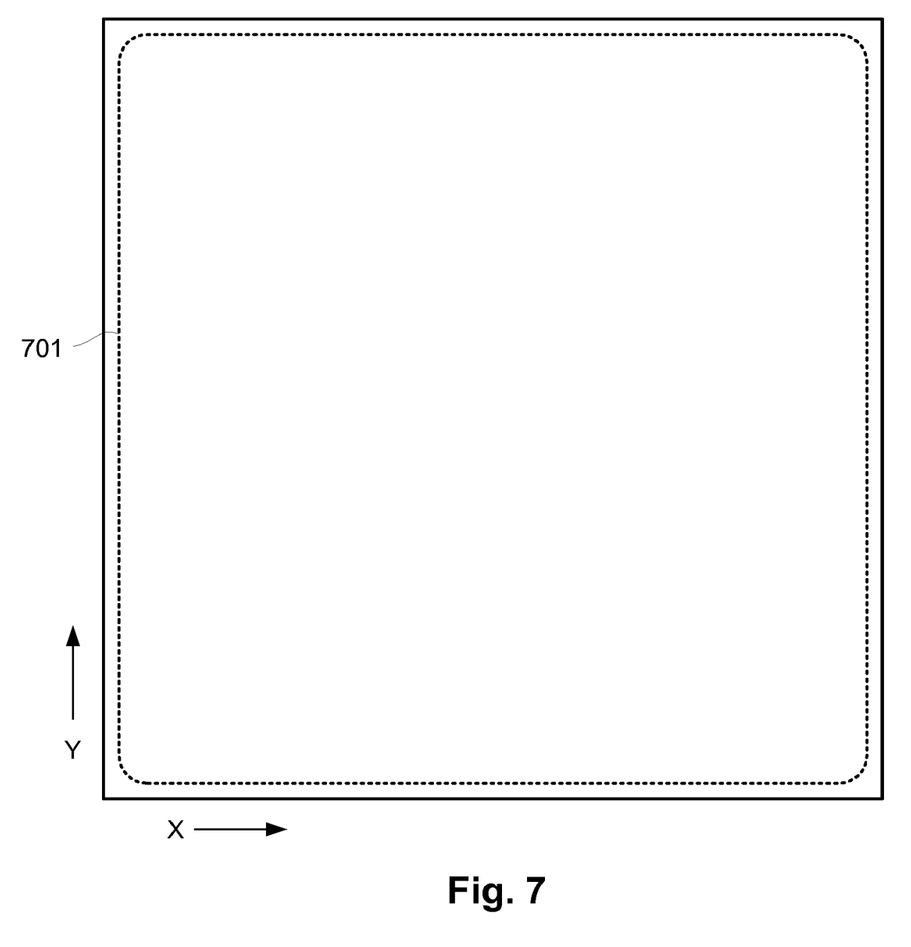
FIG. 7 is a plan view of an illustrative touchpad having a piezoelectric element extending across a plurality of sensing positions.

There are many possible uses for the system of FIG. 1. For example, such a system may be incorporated into a user input device, such as a two-dimensional touch-screen display or other touch-sensitive pad. The user input device may be part of a computing device, such as a laptop computer, a desktop computer, a mobile computer, a mobile wireless communications device (e.g., a cellular telephone), or a PDA, or part of a dedicated user interface device such as a video screen with touch input capabilities. An example of such a device is shown in FIG. 6. In this example, a touch-sensitive pad may include an array of blocks 601-613 (e.g., pixels) that each includes at least a portion of the circuit of FIG. 1, if not an entire copy of the circuit of FIG. 1. Alternatively, each of the blocks 601-613 may correspond to a different pixel or coordinate position, but may together share a single larger PZT. In such a configuration, such as shown in FIG. 7, a single PZT 701 may be added to a conventional touch-sensitive pad or display such that the location of a touch along the X and Y directions may be determined by conventional methods and the pressure may be determined using the shared PZT and circuit of FIG. 1. Thus, adding a PZT in this manner may add pressure measuring functionality to existing position sensing technologies, such as conventional touchpads/touchscreens or capacitive sensing arrays. And, depending upon the type of PZT 701, the relatively large dimensions of this PZT 701 may provide for a great deal of pressure sensitivity and/or haptic feedback due to the relatively larger amount of movement that may be potentially experienced by PZT 701.

In this way, the input device may be able to determine not only the location of a touch, but also the magnitude of the pressure exerted by the touch at various locations on the touch pad. This may be very useful where, for instance, the user desires to use a stylus input (which is becoming more common as a computer input device) to draw, where the width of the line being drawn depends on the absolute pressure of the stylus against the pad. In fact, this may be desirable for any user interface where the absolute pressure can be used, such as for determining viewing zoom level.

Thus, an apparatus and method have been described for determining the absolute pressure applied to a piezoelectric element, by feeding the piezoelectric element with a voltage pulse and measuring the transition time (e.g., rise time and/or fall time) of the pulse. In addition, because the piezoelectric element may be under constant and active control by the system, the system can rapidly change at any time from a measurement-taking mode to a haptic feedback mode, and vice versa, or even perform both measurement and haptic feedback simultaneously, without necessarily being concerned about destroying the measurement portion of the circuit with haptic feedback pulses.

The invention claimed is:

1. An apparatus, comprising a sensor configured to generate a signal that depends upon an absolute pressure applied to a piezoelectric element, wherein the sensor has an input electrically coupled to the piezoelectric element and is configured to compare a voltage at the input with a reference voltage, the sensor being configured to generate the signal based on the comparison.

2. The apparatus of claim 1, wherein the sensor is further configured to determine a time from a starting time until the voltage at the input exceeds the reference voltage, the sensor being configured to generate the signal based on the time.

3. The apparatus of claim 1, wherein the sensor is further configured to determine a time from a starting time until the voltage at the input falls below the reference voltage, the sensor being configured to generate the signal based on the time.

4. The apparatus of claim 1, further comprising a signal source electrically coupled to the piezoelectric element and the sensor, and configured to send a pulsed voltage signal to the piezoelectric element, wherein the pulsed voltage signal has a peak voltage exceeding the reference voltage.

5. An apparatus, comprising a sensor configured to generate a signal that depends upon an absolute pressure applied to a piezoelectric element, further comprising:
   a first operational amplifier having an output coupled to a first electrode of the piezoelectric element and to the sensor; and
   a second operational amplifier having an output coupled to a second electrode of the piezoelectric element.

6. An apparatus, comprising a sensor configured to generate a signal that depends upon an absolute pressure applied to a piezoelectric element, wherein the sensor comprises an operational amplifier having a first input electrically coupled to the piezoelectric element and a second input electrically coupled to a reference potential.

7. The apparatus of claim 1, wherein the apparatus is a handheld electronic device comprising a user input device, wherein the user input device comprises the sensor.

8. An apparatus, comprising a sensor configured to generate a signal that depends upon an absolute pressure applied to a piezoelectric element, wherein the sensor is configured to feed a measurement pulse to the piezoelectric element, measure a rise time of the measurement pulse, and determine the absolute pressure based on the rise time.

9. An apparatus, comprising a sensor configured to generate a signal that depends upon an absolute pressure applied to a piezoelectric element, wherein the sensor is configured to feed a measurement pulse to the piezoelectric element, measure a fall time of the measurement pulse, and determine the absolute pressure based on the fall time.

10. The apparatus of claim 5, wherein the apparatus is a handheld electronic device comprising a user input device, wherein the user input device comprises the sensor.

11. The apparatus of claim 6, wherein the apparatus is a handheld electronic device comprising a user input device, wherein the user input device comprises the sensor.

12. The apparatus of claim 8, wherein the apparatus is a handheld electronic device comprising a user input device, wherein the user input device comprises the sensor.

13. The apparatus of claim 9, wherein the apparatus is a handheld electronic device comprising a user input device, wherein the user input device comprises the sensor.

* * * * *